United States Patent
Papanu et al.

(10) Patent No.: US 7,432,177 B2
(45) Date of Patent: Oct. 7, 2008

(54) POST-ION IMPLANT CLEANING FOR SILICON ON INSULATOR SUBSTRATE PREPARATION

(75) Inventors: James S. Papanu, San Rafael, CA (US); Han-Wen Chen, San Mateo, CA (US); Brian J. Brown, Palo Alto, CA (US); Steven Verhaverbeke, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 362 days.

(21) Appl. No.: 11/154,211

(22) Filed: Jun. 15, 2005

(65) Prior Publication Data

US 2006/0286783 A1 Dec. 21, 2006

(51) Int. Cl.
*H01L 21/04* (2006.01)
(52) U.S. Cl. .................. 438/510; 438/906; 438/907; 438/908; 438/928; 257/E21.043
(58) Field of Classification Search ............. 438/510, 438/906; 257/E21.043
See application file for complete search history.

(56) References Cited

U.S. PATENT DOCUMENTS

| | | | | |
|---|---|---|---|---|
| 6,002,202 A | * | 12/1999 | Meyer et al. | 313/420 |
| 6,887,793 B2 | * | 5/2005 | Chang et al. | 438/706 |
| 6,991,739 B2 | * | 1/2006 | Kawaguchi et al. | 216/67 |
| 7,105,475 B2 | * | 9/2006 | Kim et al. | 510/176 |
| 7,276,447 B1 | * | 10/2007 | Delgadino et al. | 438/694 |
| 2003/0045098 A1 | * | 3/2003 | Verhaverbeke et al. | 438/689 |
| 2004/0018732 A1 | * | 1/2004 | Shiu et al. | 438/694 |
| 2004/0179705 A1 | * | 9/2004 | Wang et al. | 381/175 |

\* cited by examiner

*Primary Examiner*—Scott B. Geyer
*Assistant Examiner*—Angel Roman
(74) *Attorney, Agent, or Firm*—Blakely, Sokoloff, Taylor & Zafman, LLP (57) ABSTRACT

A combination of a dry oxidizing, wet etching, and wet cleaning processes are used to remove particle defects from a wafer after ion implantation, as part of a wafer bonding process to fabricate a SOI wafer. The particle defects on the topside and the backside of the wafer are oxidized, in a dry strip chamber, with an energized gas. In a wet clean chamber, the backside of the wafer is treated with an etchant solution to remove completely or partially a thermal silicon oxide layer, followed by exposure of the topside and the backside to a cleaning solution. The cleaning solution contains ammonium hydroxide, hydrogen peroxide, DI water, and optionally a chelating agent, and a surfactant. The wet clean chamber is integrated with the dry strip chamber and contained in a single wafer processing system.

21 Claims, 8 Drawing Sheets

FIGURE 1A

Post ion-implant

POST-ION IMPLANT CLEANING FOR SILICON ON INSULATOR SUBSTRATE PREPARATION

TECHNICAL FIELD

The present invention relates to the field of semiconductor processing and more specifically to methods for post-ion implant cleaning of the topside and the backside of a substrate during silicon on insulator preparation.

BACKGROUND

Figure 1A:
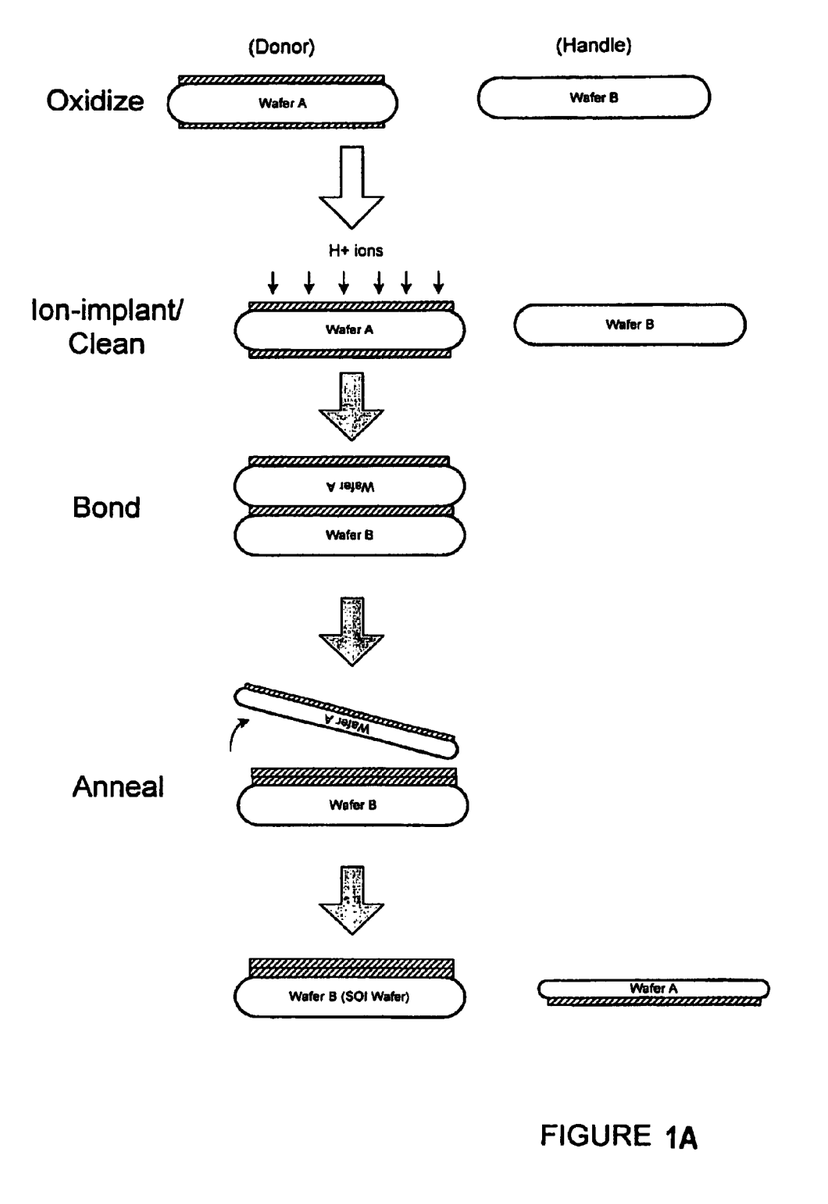
FIG. 1A illustrates a typical wafer bonding method.

Circuits fabricated with silicon-on-insulator (SOI) substrates show reduced parasitic capacitance compared to bulk or epitaxial substrates. Less capacitance results in lower power consumption and higher speed. SOI devices are also useful for memory applications because of their high-radiation single-event-upset (SEU) immunity. Wafer bonding is one method for manufacturing SOI substrates, which involves two silicon wafers bonded and most of the silicon from one wafer is removed and the device is built into the remaining silicon over the now-buried oxide. FIG. 1A is a simplified illustration of a typical wafer bonding method, which begins with a first Wafer A (also known as the donor wafer) and a second Wafer B (as known as the handle wafer). Wafer A is oxidized to form what will become the buried oxide. In a thermal oxidizing environment, both the topside and backside of Wafer A can form oxidized layers, although only the topside is used for wafer bonding. Wafer A is then implanted with an ion, such as $H^+$ below the oxide surface into bulk silicon. The depth of the $H^+$ implantation determines the thickness of silicon above the buried oxide. Wafers A and B are cleaned and temperature bonded face-to-face. The bonded wafers are annealed, during which time the implanted $H^+$ forms a gas and Wafer A delaminates near the peak of the implanted $H^+$. Wafer B, which now has the buried oxide layer becomes the SOI wafer, while Wafer A becomes the sacrificial wafer. Wafer A, which is now thinner than before the wafer bonding process, can be used in another wafer bonding process as Wafer B.

Figure 1B:
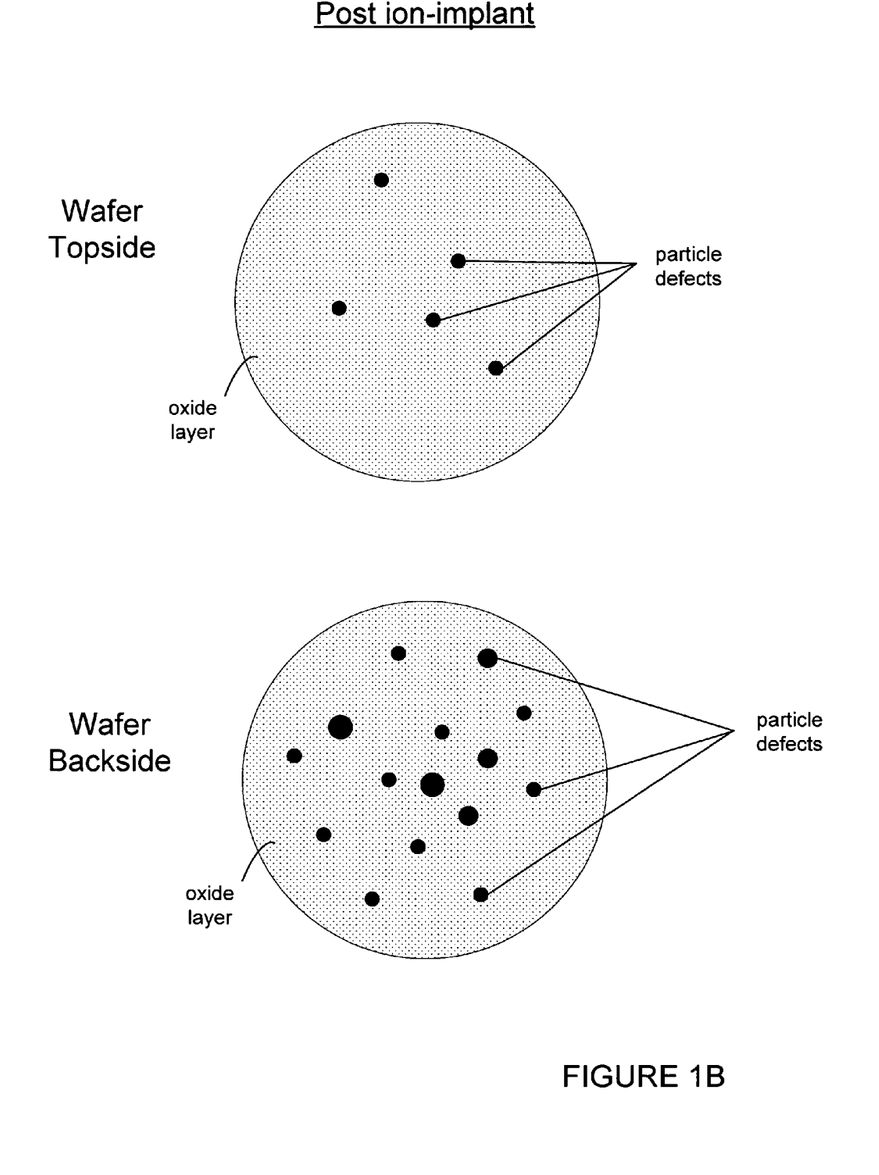
FIG. 1B illustrates particle defects on the topside and the backside of a wafer after ion implantation.

The $H^+$ implantation process is relatively long, with implant times taking up to several hours, and detrimentally, the topside and backside of the wafer are left with particle defects. The backside of the wafer typically collects more particle defects relative to the topside, because the backside is subjected to most of the handling and contact with components of the ion implantation chamber and the wafer handling device used to center and place the wafer in the ion implantation chamber. One type of defect results from the wafer's contact with elastomeric components such as the wafer support pedestal in the ion implantation chamber and the wafer handling device used to center and place the wafer in the ion implantation chamber. FIG. 1B illustrates the topside and backside of a wafer after an ion implantation process. In some cases the particle pattern on the backside of the wafer shows an image of the support pedestal or wafer transfer device. The backside of the wafer typically collects more particle defects relative to the topside, because the backside is subjected to most of the handling and contact with components of the ion implantation chamber. State of the art methods to remove post-$H^+$ implant defects are not very effective. A cleaning tool such as a wet bench is used, in which the wafer is immersed in a cleaning liquid such as SC-1 or SC-2. Another state of the art method involves treating the backside of the wafer with an etchant solution (such as hydrofluoric acid) because a thermal silicon oxide film layer is formed on the backside of the donor wafer (i.e., Wafer A) during the initial oxidation process prior to ion implantation. The idea is to "lift off" the particle defects by etching the silicon oxide film layer below the particle defects. Instead, the particle defects micromask the silicon oxide from the etchant solution to form small islands or mesas of particle defect/silicon oxide layers on the backside.

SUMMARY

A combination of a dry oxidizing, wet etching, and wet cleaning processes are used to remove particle defects from a wafer after ion implantation, as part of a wafer bonding process to fabricate a SOI wafer. The particle defects on the topside and the backside of the wafer are oxidized, in a dry strip chamber, with one or more energized gases. In a wet clean chamber, the backside of the wafer is treated with an etchant solution to remove a thermal silicon oxide layer, followed by exposure of the topside and the backside to a cleaning solution. The cleaning solution contains ammonium hydroxide, hydrogen peroxide, DI water, and optionally a chelating agent, and a surfactant. The wet clean chamber is integrated with the dry strip chamber and contained in a single wafer processing system. In an alternative embodiment, the topside of the wafer is also exposed to an etchant solution for enhanced cleaning of particle defects.

Other features and advantages of embodiments of the invention will be apparent from the accompanying drawings and from the detailed description that follows below.

BRIEF DESCRIPTION OF THE DRAWINGS

Embodiments of the present invention are illustrated by way of example, and not limitation, in the figures of the accompanying drawings in which.

DETAILED DESCRIPTION

The present inventions are novel cleaning methods for a wafer using a single wafer processing system. In the following description numerous specific details are set forth in order to provide a thorough understanding of the present invention. One of ordinary skill of the art will appreciate that these specific details are for illustrative purposes only and are not intended to limit the scope of the present invention. Additionally, in other instances, well-known processing techniques and equipment have not been set forth in particular detail in order to not unnecessarily obscure the present invention.

Any reference in the specification to "one embodiment" or "an embodiment" means that a particular feature, structure, or characteristic described in connection with the embodiment is included in at least one embodiment of the claimed subject matter. The appearances of the phrase, "in one embodiment" in various places in the specification are not necessarily all referring to the same embodiment.

Embodiments of an apparatus and method to remove particle defects from the topside and the backside of a wafer after ion implantation are described. The method also removes a thermal silicon oxide layer from the backside of the wafer. The post-ion implant cleaning can be part of a wafer bonding process to fabricate a SOI wafer. For example, the donor wafer having oxidized layers (e.g., silicon oxide) on the topside and backside is placed in an ion implantation chamber. The wafer is handled by a robotic arm that centers the wafer over a wafer support pedestal. $H^+$ ions are implanted beneath the surface of an oxidized layer to a desired depth. The wafer's contact with the robotic arm and more significantly, the wafer support pedestal introduces defects such as polymeric, organic, and inorganic particles to the wafer surfaces. To remove the particles defects, in one embodiment, the wafer surfaces are processed with a combination of dry oxidizing, wet etching, and wet cleaning operations. The combination of these different operations can be implemented in a multi-chamber, wafer processing system that integrates a dry strip chamber (to oxidize the polymeric and organic particle defects) and a wet clean chamber (to dispense etchant and cleaning solutions to the wafer surfaces).

Figure 2:
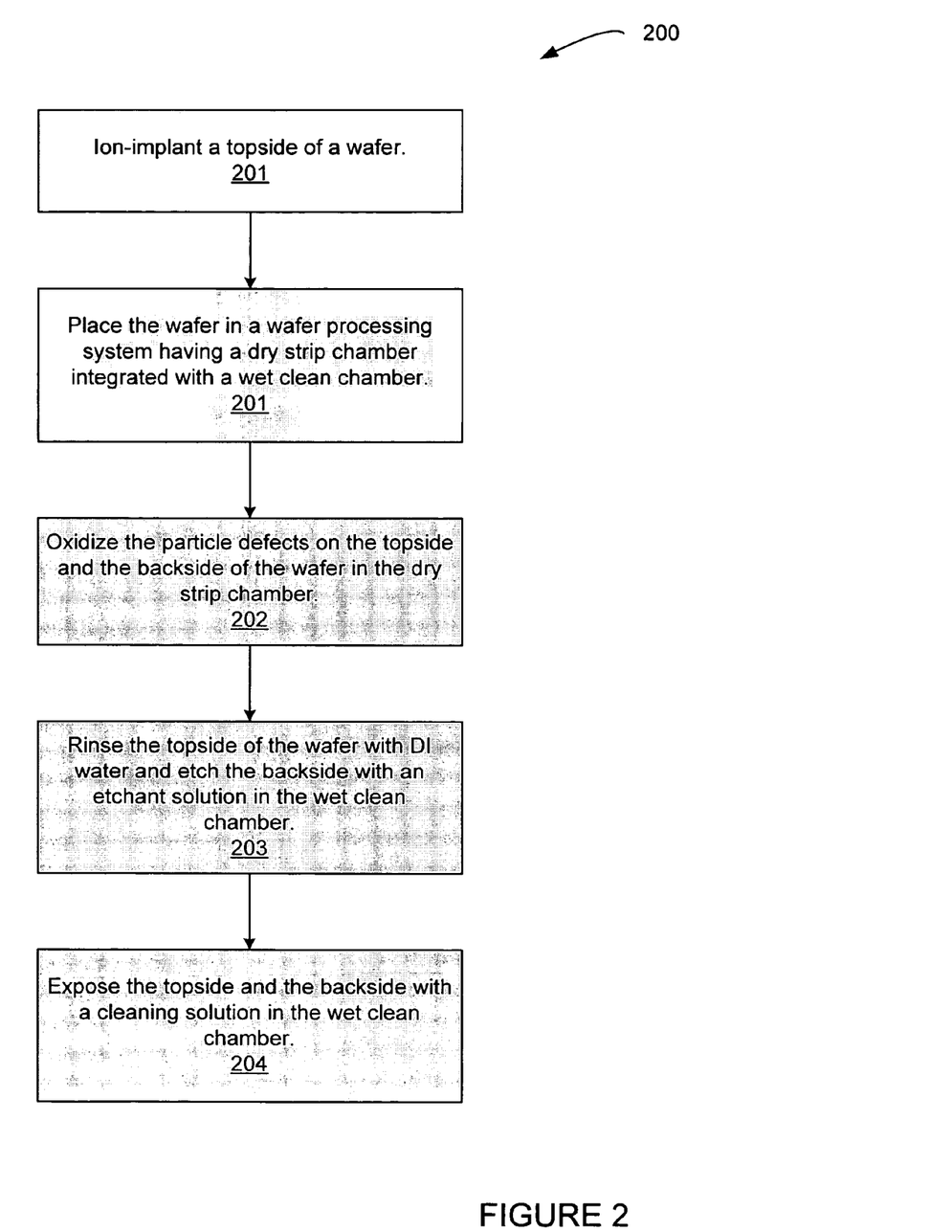
FIG. 2 is a flowchart generally illustrating a method to remove surface defects after ion implantation.

FIG. 2 is a flowchart 200 generally illustrating a method to remove particle defects after ion implantation of the topside of a wafer. The wafer is placed in a single-wafer processing system that includes multiple chambers, and in particular, a dry strip chamber integrated with a wet clean chamber, block 201. The integrated system enables the wafer to be easily transferred in and out of one type of chamber to another type of chamber to combine dry and wet wafer processing platforms. Additionally, the dry strip chamber is equipped to treat the topside or both sides simultaneously and the wet clean chamber is equipped to treat both sides of the wafer simultaneously or independently, as well as treating each side differently. For example, the wet clean chamber is equipped to dispense a cleaning solution to the topside while dispensing an etchant solution to the backside. The wafer is placed in the dry strip chamber to oxidize the particle defects for removal. For example, the topside and backside are exposed to oxygen radicals that oxidize organic or polymeric particles for removal from the wafer surfaces, block 202.

The wafer is also placed in a wet clean chamber to remove the silicon oxide layer from the backside and to treat both surfaces with a cleaning solution. In one embodiment, the topside of the wafer (with the silicon oxide layer) is treated with DI water and the backside of the wafer is treated with an etchant solution such as dilute hydrofluoric acid (HF), block 203. The topside and backside are treated differently because the etchant should not be exposed to the silicon oxide layer on the topside. The backside, however, is exposed to the etchant solution for deep cleaning to prevent cross-contamination of particles from the backside to the topside. The oxidation process first performed in the dry strip chamber removes or reduces in size the organic and polymeric particle defects, thereby exposing the silicon oxide to react with the etchant solution. The topside and backside of the wafer are then treated with a cleaning solution in the same wet clean chamber, block 204. In one embodiment, the cleaning solution contains a modified SC-1 solution with the addition of surfactants and chelating agents.

Figure 3:
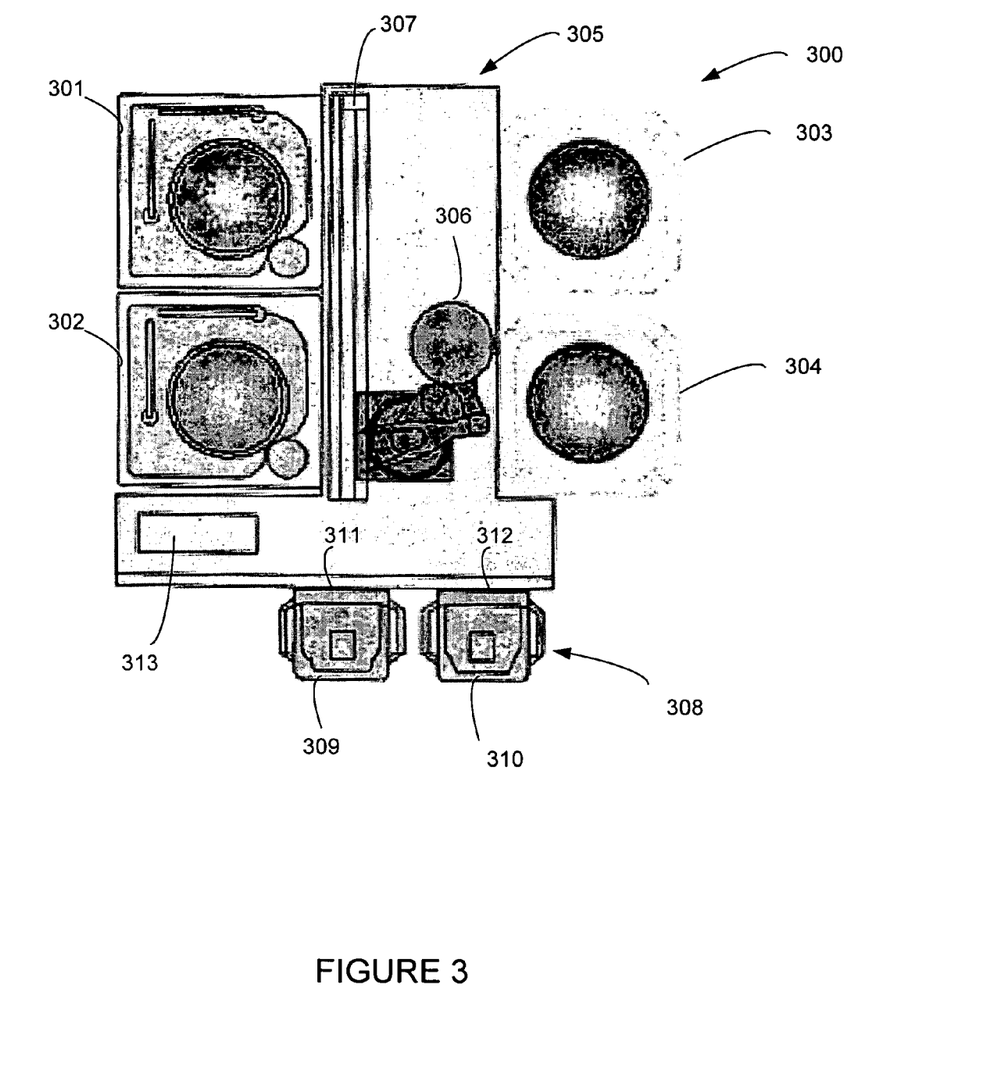
FIG. 3 illustrates one embodiment of a multi-chamber wafer processing system.

Portions of the defect removal process are illustratively performed in a multi-chamber, single wafer processing system 300 shown in FIG. 3, which includes chambers for performing both wet clean and plasma clean processing. The particular embodiment of the processing system 300 shown herein is provided to illustrate the invention, and should not be used to limit the scope of the invention. Processing system 300 includes a central transfer chamber 305 containing a substrate handling device 306, such as a robot. The wafer handling device 306 moves linearly along a track 307 to facilitate access to all of the processing chambers. Directly coupled to the transfer chamber 305 are multiple wafer processing chambers represented by wet cleaning chambers 301, 302, and dry strip chambers 303, 304. Each chamber is coupled to the transfer chamber 305 by a separately closable and sealable opening, such as a slit valve. The wafer handling device 306 is able to transfer wafers from one processing chamber to another processing chamber that is attached to the transfer chamber 305. In the embodiment shown, the wafer handling device 306 is a dual blade, single arm, single wrist robot. Other types of robots known in the art may be used to access the processing chambers.

The transfer chamber 305 is coupled to one or more wafer input/output modules 308 that provide and receive wafers to and from the integrated processing system 300. In one embodiment of the system 300, the input/output modules 308 each include a front opening unified pod (FOUP), 309, 310. The wafer handling device 306 accesses FOUPs 309, 310 through sealable access doors 311, 312, respectively.

System 300 also includes a system computer 313 that is connected to and controls each chamber (e.g., chambers 301, 302, 303, 304) and the wafer handling device 306. Generally, the system computer 313 can control all aspects of operation of the system 300 either by direct control of the chambers or handling device, or by controlling the computers associated with the chambers and handling device 306. The system computer 313 also enables feedback from one chamber to be used to control the flow of wafers through the system 300 and/or control the processes or operation of the various chambers and tools to optimize wafer throughput. The system computer 313 can include a central processing unit (CPU), a memory, and support circuits. The CPU can be of any form of a general-purpose computer processor used in an industrial setting. Software routines can be stored in the memory, such as random access memory, read only memory, floppy or hard disk, or other form of digital storage. The support circuits can include cache, clock circuits, input/output sub-systems, power supplies, and the like. The software routines, when executed by the CPU, transform the CPU into a specific purpose computer that controls the integrated processing system 300 such that the processes are performed in accordance with the present invention. The software routines may also be stored and/or executed by a second controller (not shown) that is located remotely from the system 300.

Figure 4:
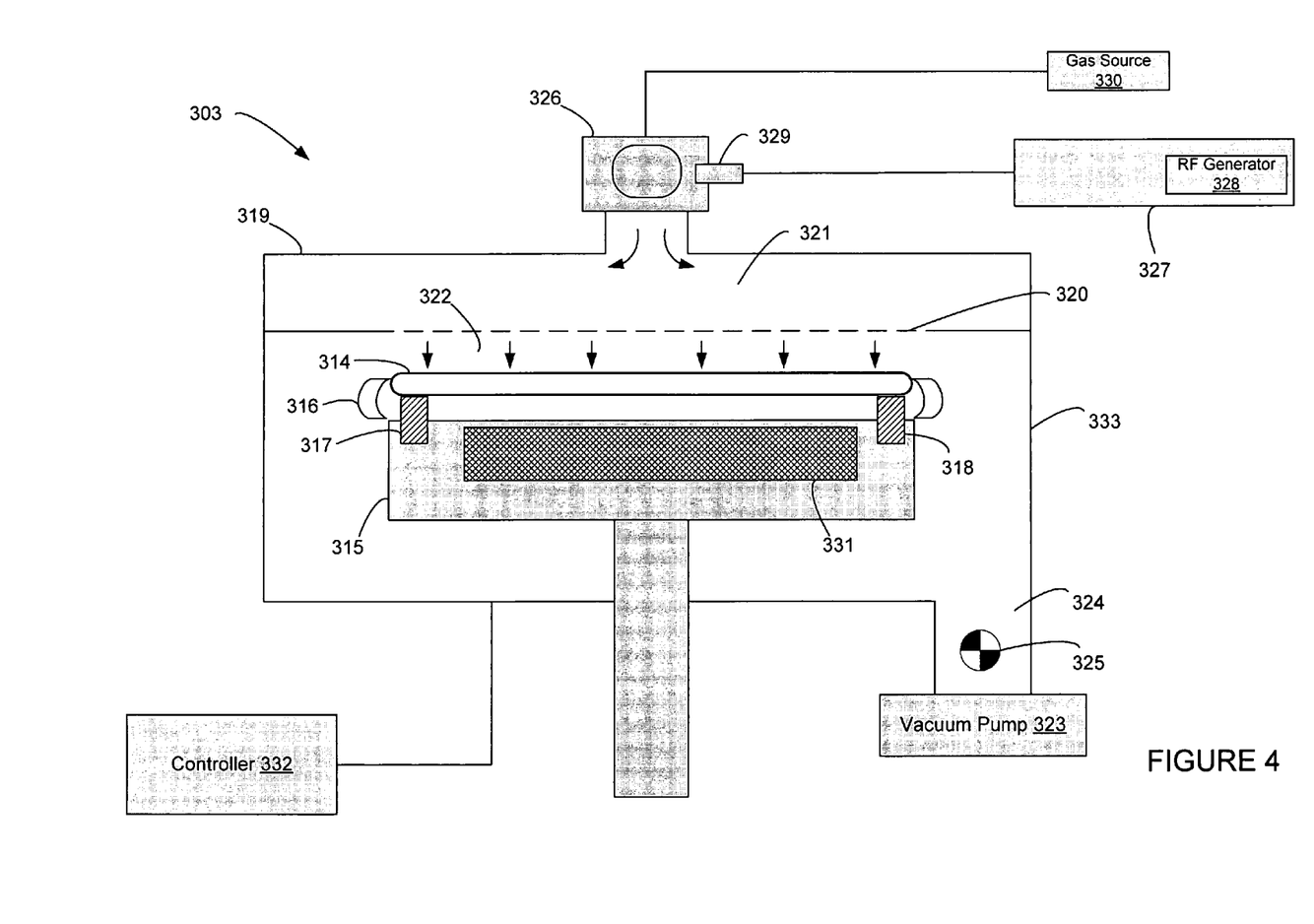
FIG. 4 is a schematic diagram of a dry strip chamber that is part of the wafer processing system of FIG. 3.

FIG. 4 is a schematic diagram showing a more detailed view of a dry strip chamber 303 that can be used to practice portions of a method to remove defects from a wafer during a wafer bonding cleaning process. Dry strip chamber 304 can include identical components as chamber 303, so details of chamber 303 only are provided. Chamber 303 generally is a vacuum vessel, which includes a wafer pedestal 315, a vacuum pump 323, a gas distribution plate (i.e., showerhead) 320 covered with a lid 319, which defines a gas mixing volume 321 and a reaction volume 322, and a sidewall 333. The lid 319 and sidewall 333 are generally formed from a metal (e.g., aluminum (Al), stainless steel, and the like). The wafer pedestal 315 supports a wafer 314 within the reaction volume 322, and a wafer centering ring 316 is positioned above the wafer pedestal 315 to maintain the wafer 314 directly below the gas distribution plate 320. Lift pins 317, 318 can extend from the wafer support pedestal 315 (as shown in FIG. 4) to raise the wafer 314 above the wafer support pedestal 315 for transfer in and out of chamber 303 by wafer handling device 306. The extended lift pins 317, 318 can also be used to form another reaction volume between the backside of the wafer and the wafer support pedestal 315, thereby allowing the backside of the wafer 314 to be treated without the need to flip wafer 314 over with wafer handling device 306. When not in an extended position, the lift pins 317, 318 rest slightly recessed below the top surface of the wafer support pedestal 315. In one embodiment, a source of heat, such as an embedded resistive heater 331, can be disposed within the wafer pedestal 315. The temperature of the pedestal 315 can be controlled between about 25 and 400 degrees Celsius.

The vacuum pump 323 is coupled to an exhaust port 324 which extends from the sidewall 333. The vacuum pump 323 is used to maintain a desired gas pressure in chamber 303, as well as expel the post-processing gases and other volatile compounds from chamber 303. In one embodiment, the vacuum pump 323 includes a throttle valve 325 to control the gas pressure.

A power source 327 and a gas source 330 are coupled to a remote plasma chamber 326. In one embodiment, the power source 327 includes a radio-frequency (RF) generator 328 and an applicator 329 extended towards remote plasma chamber 326. The applicator 329 is inductively coupled to the remote plasma chamber 326 and energizes a process gas (or gas mixture) to a plasma in the remote plasma chamber 326. Alternatively, a microwave plasma with a 2.45 GHz generator/magnetron, operating at powers of about 1-6 KW to produce plasma in a tubular dielectric applicator can be used. In this embodiment, the remote plasma chamber 326 is within an RF powered toroid. This toroidal geometry confines the plasma and facilitates efficient generation of radical species and provides low electrical fields perpendicular to the plasma chamber surfaces. It also combines the generator 328 and chamber 326 into a single unit. Operating frequency is about 200-600 KHz with power up to about 6 KW. A conduit coupled to the gas source 330 is used to deliver a process gas to the remote plasma chamber 326. The process gas is ionized and dissociated to form reactive species in the remote plasma chamber 326. The neutral reactive species are directed into the mixing portion 321 and through the openings of the gas distribution plate 320 to the reaction portion 322.

Similar to the operation of system computer 313, controller 332 executes software routines that controls chamber 303 such that specific processes are performed in accordance with the present invention. The software routines may also be stored and/or executed by a system computer 313 (as shown in FIG. 3) that is located remotely from the chamber 303.

Figure 5:
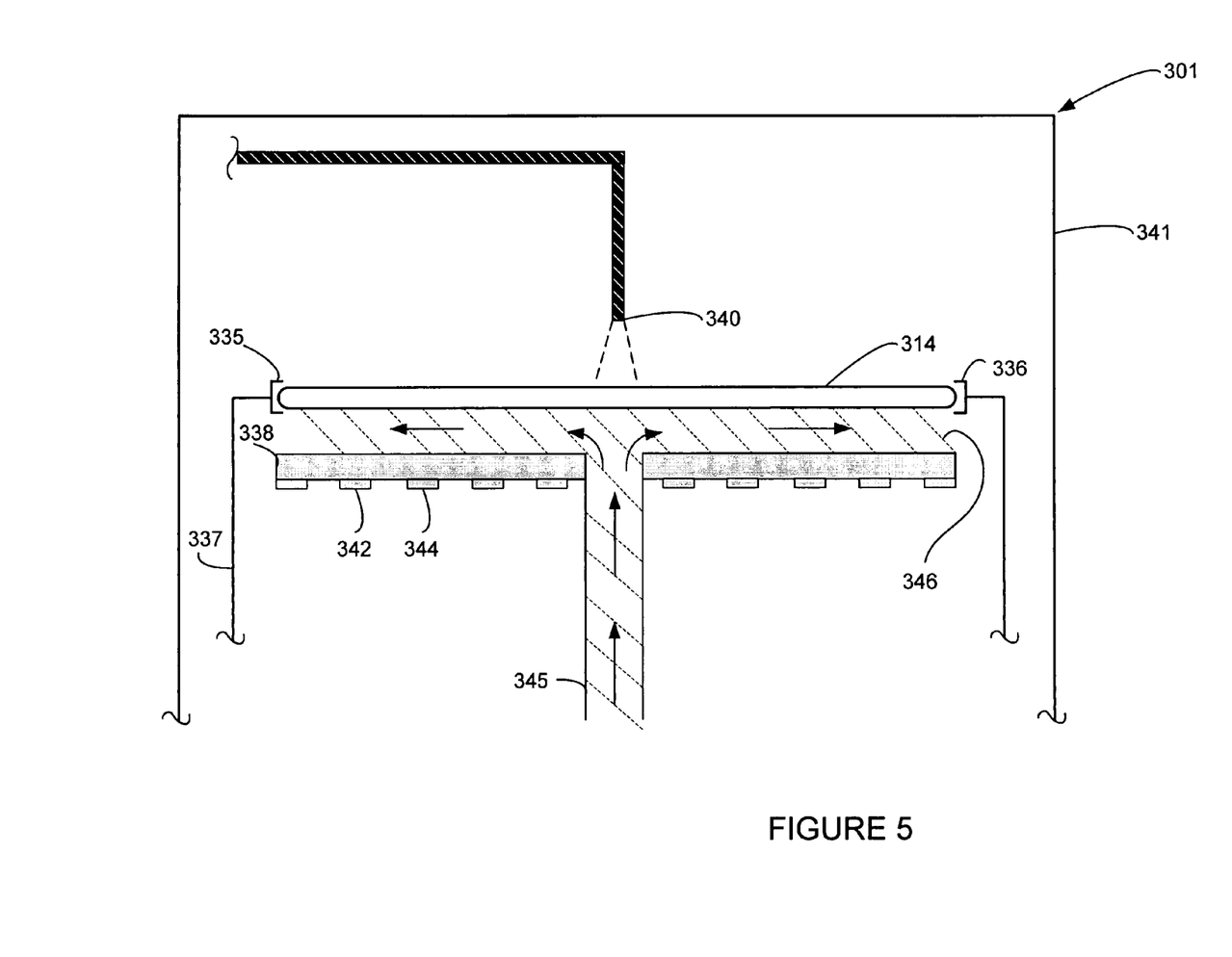
FIG. 5 is a schematic diagram of a wet clean chamber that is part of the wafer processing system of FIG. 3.

FIG. 5 is a schematic diagram showing a more detailed view of a wet clean chamber 301 that can be used to practice portions of a method to remove defects from a wafer during a wafer bonding process. Wet clean chamber 302 includes the same components as chamber 301. Accordingly, details of chamber 301 only are provided. In particular, chamber 301 is a single-wafer processing chamber that dispenses a fluid such as a chemical etchant or cleaning solution to one or both sides of the wafer. In alternative embodiments, single wet clean chamber 301 can be used to dispense other types of liquids or gases during wafer processing (e.g., rinsing solutions, gases). Chamber 301 includes at least one moveable dispense arm, and can include a spraying nozzle 340 to enhance dispensing of processing fluid to the top surface of wafer 314.

Chamber 301 also includes a plate 338 with a plurality of acoustic or sonic transducers (represented by transducers 342, 344) located thereon. Plate 338 is preferably made of aluminum but can be formed of other materials such as but not limited to stainless steel and sapphire. The plate 338 is preferably coated with a corrosion resistant fluoropolymer such as Halar. Additionally, transducer-covered plate 338 has a substantially same shape as wafer 314 and covers the entire surface area of wafer 314. The transducers 342, 344 cover a majority of the backside of plate 338 as shown in FIG. 5. The transducers 342, 344 preferably generate sonic waves in the frequency range between 400 kHz and 8 MHz. In an embodiment of the present invention the transducers are piezoelectric devices. The transducers 342, 344 create acoustic or sonic waves in direction perpendicular to the surface of wafer 314. The transference of ultrasonic or megasonic energy, and thus agitation, to the wafer surface improves the removal rate of contaminants or particles from the wafer surface.

During processing, wafer 314 is held at distance of about 3 mm above the top surface of plate 338, which can be moved up and down. The wafer 314 is secured by a plurality of fingers or clamps 335, 336 coupled to a wafer support 337 which can rotate wafer 314 about at central axis. The wafer support 337 can rotate or spin wafer 314 about its central axis at a rate between 0-3000 rpm. Additionally, transducer covered plate 338 has a substantially same shape as wafer 314 and covers the entire surface area of wafer 314. Chamber 301 also includes sealed sidewalls 341 in which nozzle 340, wafer 314, and plate 338 are situated as shown in FIG. 5 (an additional baffle not shown, can be used to minimize chemical spraying onto the wafer-transfer opening in the chamber sidewall). During use, a processing fluid such as DI water, an etchant, or cleaning solution is fed through a channel 345 and through plate 338 and fills the gap between the backside of wafer 314 and plate 338 to provide a liquid filled gap 346 through which acoustic waves generated by transducers 342, 344 can propagate to wafer 314. The DI water fed between wafer 314 and plate 338 can be degassed so that cavitation is suppressed in the DI-water-filled gap 346 where the acoustic waves are strongest thereby reducing potential damage to wafer 314. For un-patterned wafer cleaning applications such as the SOI application described here, degassing is not necessary.

Although processing system 300 has been described with respect to dry strip chamber 303 and wet clean chamber 301, other types of processing chambers can be integrated into system 300 such as chambers for etching, oxidation, photoresist stripping, substrate inspection and the like.

Figure 6:
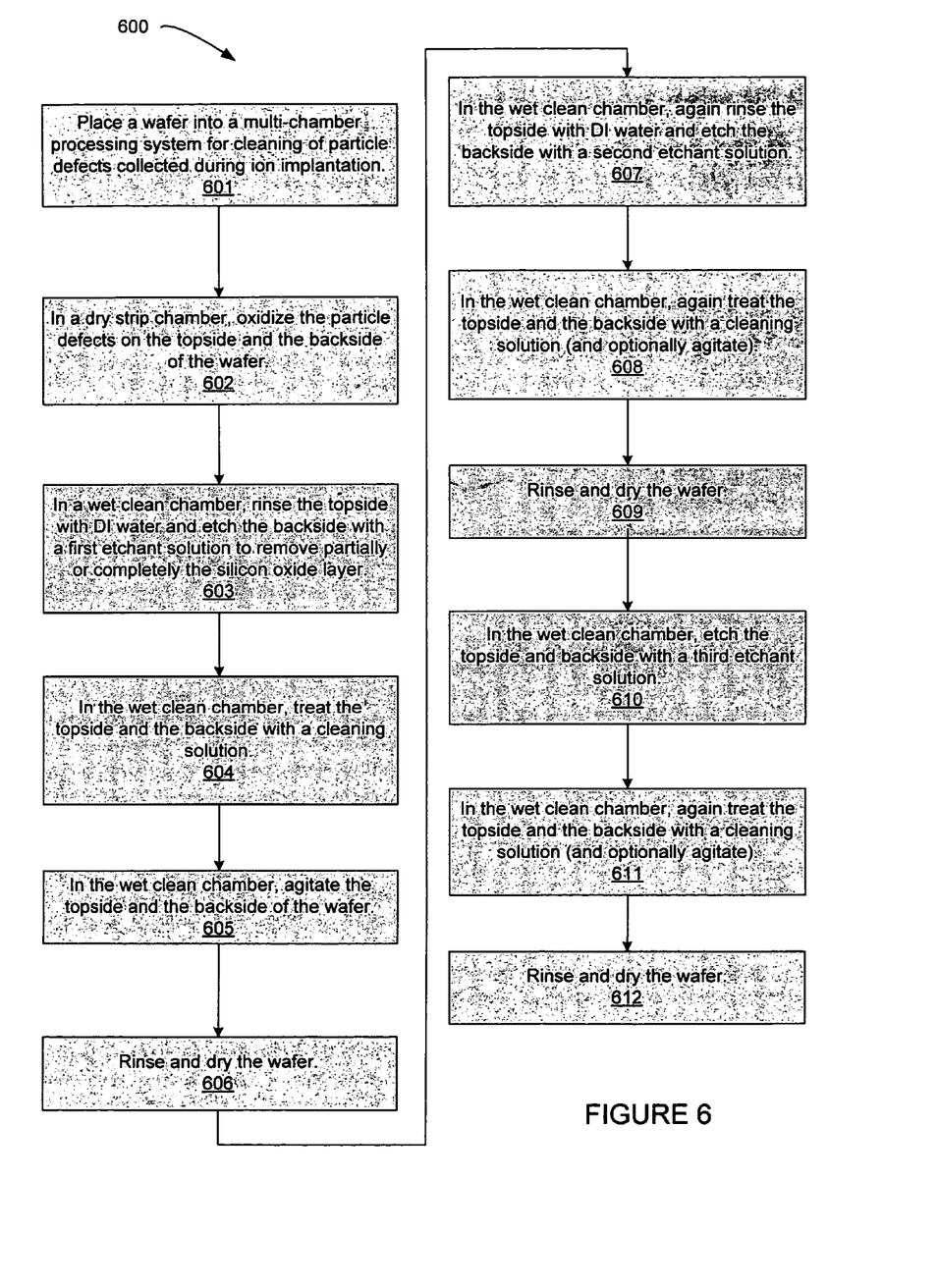
FIG. 6 is a flowchart of a method to remove defects and contaminants from the topside and backside of a wafer during an SOI fabrication process.

FIG. 6 is a flowchart 600 showing one embodiment of a method to remove particle defects from the topside and backside of a wafer, and to remove partially or completely a thermal silicon oxide layer from the backside during a wafer bonding process. In particular, the flowchart 600 is described with respect to processing a donor wafer after ion implantation, the topside and backside of the wafer having a silicon oxide layer, to produce a wafer having a clean topside with slight or no oxide layer removal and a clean backside that has partial or complete removal of the oxide layer. Prior to ion implantation, a thermal silicon oxide layer can form on the backside when the oxide layer on the topside is formed during the early stages of the wafer bonding process. During the ion-implantation process (e.g., $H^+$ ions implanted into the oxide layer of the wafer 314), particle defects such as polymeric or organic materials can collect on the wafer surfaces from the wafer's contact with components of the ion implantation chamber (e.g., elastomeric surface of the wafer support pedestal or wafer handler). To remove the particle defects and clean or remove the thermal silicon oxide layer from the backside, the wafer is treated with a combination of dry oxidation, wet etching, and wet cleaning processes in a multi-chamber wafer processing system.

The ion implanted wafer is placed in a multi-chamber, single-wafer processing system (e.g., system 300) to remove the defects and contaminants from the wafer surfaces, block 601. The processing system is adaptable to receive a wafer of any diameter, for example, between 200 mm to 300 mm. The processing system can include wafer input/output modules (e.g., module 308) to receive the wafer. A wafer handling device (e.g., 306) such as a robot grabs the wafer through a FOUP (e.g., FOUP 309) to transfer the wafer from one processing chamber to another during the cleaning process. The wafer handling device is contained within a transfer chamber (e.g., chamber 305), which also includes track (e.g., track 307) to enable the wafer handling device to interact with the different processing chambers.

In one embodiment, the wafer processing system includes one or more dry strip chambers (e.g., chambers 303, 304) and wet clean chambers (e.g., chambers 301, 302). The wafer is transferred into a dry strip chamber (e.g., 303), and the particle defects on the topside and backside are oxidized, block 602. The process gas can be energized as described above with respect to chamber 303 of FIG. 4. In one embodiment, for organic or polymeric particle defects, an oxygen-based processing gas is energized to produce the species to react with the particle defects for oxidation. In alternative embodiments, can also include $N_2$, $H_2$, $H_2O$, and $NH_3$ can also be included. The topside and backside can be exposed to the reactive species from about 10 seconds to about 500 seconds. In one particular embodiment, the topside and backside are exposed to the reactive species for about 120 seconds, with a pedestal temperature of about 200° C., an $O_2$ flowrate of about 8 SLM, and a $N_2$ flowrate of about 0-10% of the $O_2$ flowrate. The chamber pressure can be in a range of about 0.75-2.5 Torr. In one particular embodiment, the chamber pressure is about 1.5 Torr. The organic/polymer particles can be silicone elastomers used to fabricate the wafer support in the ion implant system. The topside and backside particle defects can be oxidized simultaneously in the dry strip chamber. Lift pins (e.g., pins 317, 318) can be extended from the wafer support pedestal 315 to form reaction volumes near the topside and backside of the wafer. Alternatively, the particle defects can be oxidized in separate operations for the topside and the backside. For example, the reactive species is diffused over the topside first, and the wafer is then flipped over using a wafer handling device (e.g., 306) to process the backside. In another example, the dry strip process can be limited to only the topside or only the backside. In an alternative embodiment, the dry oxidation process can be substituted with a wet oxidation process. A sulfuric peroxide solution is applied to the topside and the backside of the wafer for the initial removal of particle defects. This wet oxidation process can be performed in one of the wet clean chambers (e.g., chamber 302).

The wafer can then be transferred to a wet clean chamber (e.g., chamber 301) for cleaning of the topside and for removing partially or completely the thermal silicon oxide layer on the backside. In the first operation performed in the wet clean chamber, the topside of the wafer is rinsed with DI water and the backside is exposed to an etchant solution to etch away some of the silicon oxide, block 603. With respect to the backside, because the particle defects have been removed during the oxidation process, the etchant solution can react with the silicon oxide. The micromasking effect of the particle defects to the silicon oxide is thus avoided. The etchant solution dispensed to the backside can be diluted hydrofluoric acid (HF) or buffered hydrofluoric acid. The DI water to the topside and the etchant solution to the backside can be dispensed simultaneously, using a nozzle (e.g., nozzle 340) positioned over the wafer and a channel through the wafer support pedestal. In one embodiment, the etchant solution can be about 0.1% to about 40% HF by weight, and in one particular embodiment, is about 2.5% HF by weight. The etchant solution is dispensed on the spinning backside of the wafer between about 10 seconds to about 60 seconds, and in a particular embodiment, for about 40 seconds.

The topside and backside of the wafer is then treated with a cleaning solution (in the same wet clean chamber), block 604. The cleaning solution, in one embodiment, is a modified SC-1 clean solution containing ammonium hydroxide ($NH_4OH$), hydrogen peroxide ($H_2O_2$), and $H_2O$. Optionally, a chelating agent and a surfactant can be added to the cleaning solution. In one particular embodiment, the modified SC-1 solution may be formulated by mixing AM-1 solution (manufactured by Mitsubishi Chemical America, Inc., of White Plains, N.Y., U.S.A.) which contains ammonium hydroxide, a chelating agent, and a surfactant with hydrogen peroxide and DI water. The purpose of the chelating agent is to bind metallic ion impurities to the chelating agent. Examples of chelating agents that can be used in the cleaning solution include ammonia and amine containing compounds such as ethylenediamine, and acid chelating agents such as citric and oxalic acids. The purpose of the surfactant is to reduce the surface tension of the wafer. The surfactant can be nonionic, anionic, cationic, or a mixture of surfactants. Examples of surfactants that can be added to the cleaning solution include polyoxyethylene butylphenyl ether and polyoxyethylene alkylphenyl sulfate. In one embodiment, the surfactant is present in the cleaning solution in a range between about 5 ppm to about 1000 ppm. The mixing ratios of AM-1:$H_2O_2$:$H_2O$ can be between about 5:1:1 to about 50:5:1, and in one particular embodiment, the ratio is about 40:2:1. The exposure of the topside and backside to the cleaning solution can be repeated more than once.

The exposure of the topside and backside to the cleaning solution can be combined with an agitation process with megasonic energy generated by transducers (e.g., transducers 342, 344 described above with respect to chamber 301 of FIG. 5), block 605. The transducers create acoustic or sonic waves in direction perpendicular to the surface of wafer and thus agitation. This can improve the removal rate of particles and of contaminants by increasing the diffusion rate of contaminants removed from the wafer surface. For example, megasonic energy can be applied between about 10 Watts (W) to about 1000 W for a 300 mm wafer having a frequency between about 0.5 MHz to about 5 MHz. Following the exposure to the cleaning solution (e.g., the modified SC-1 solution containing AM-1 solution, hydrogen peroxide, and DI water) with or without agitation, the wafer is rinsed with DI water and dried, for example spin-drying the wafer, block 606.

The wafer undergoes a repeated wet cleaning process in which the topside is rinsed again with DI water and the backside is treated with an etchant solution, block 607. In one embodiment, the etchant solution in this repeated operation has a lower acidic concentration relative to the etchant solution used in the prior operation (i.e., block 603). For example, the etchant solution is about 0.15% HF by weight. The wafer is then treated with a cleaning solution, which can have the same or similar formulation as used in the first wet cleaning process, block 608. For example, the cleaning solution is a modified SC-1 solution containing ammonium hydroxide, a chelating agent, and a surfactant with hydrogen peroxide and water. The exposure of the topside and backside to the cleaning solution in this second wet cleaning process can be repeated more than once. Following the exposure to the cleaning solution (optionally with megasonics agitation), the wafer is rinsed with DI water and dried, block 609. In the foregoing description, wafer cleaning process should be not construed as being limited to the order in which the different processes have been described. In alternative embodiments, the combination of oxidizing and/or wet cleaning can be varied. For example, the ion implanted wafer can first be treated with a wet cleaning process, followed by the oxidation process and another wet cleaning process. Alternatively, only a dry stripping process can be performed on the topside and backside of the wafer. The use of the multi-chamber processing system allows for a number of different cleaning combinations. In another embodiment, a sulfuric/peroxide (SPM) mixture wet chemistry can be used as an alternative to the dry oxidation operation performed in the dry strip chamber.

In an alternative embodiment, SOI cleaning can be enhanced by a third wet cleaning operation in which both the topside and the backside are exposed to another etchant solution. For example, a less aggressive concentration of about 0.15% weight HF is exposed to the topside and backside for about 10-20 seconds, block 610. The topside's exposure to an etchant solution enhances removal of any particles and contaminants, and the relatively low concentration and short exposure time of the HF solution prevents any significant amount of the silicon oxide layer on the topside from being removed (relative to the backside). The backside's exposure to the HF solution also enhances removal of any remaining particles and contaminants. The wafer is treated again with a cleaning solution, which can have the same or similar formulation as used in the first and second wet cleaning processes, block 611. For example, the cleaning solution can be a modified SC-1 solution containing ammonium hydroxide, a chelating agent, and a surfactant with hydrogen peroxide and water. Following the exposure to the cleaning solution (optionally with agitation), the wafer is rinsed with DI water and dried, block 612.

Figure 7:
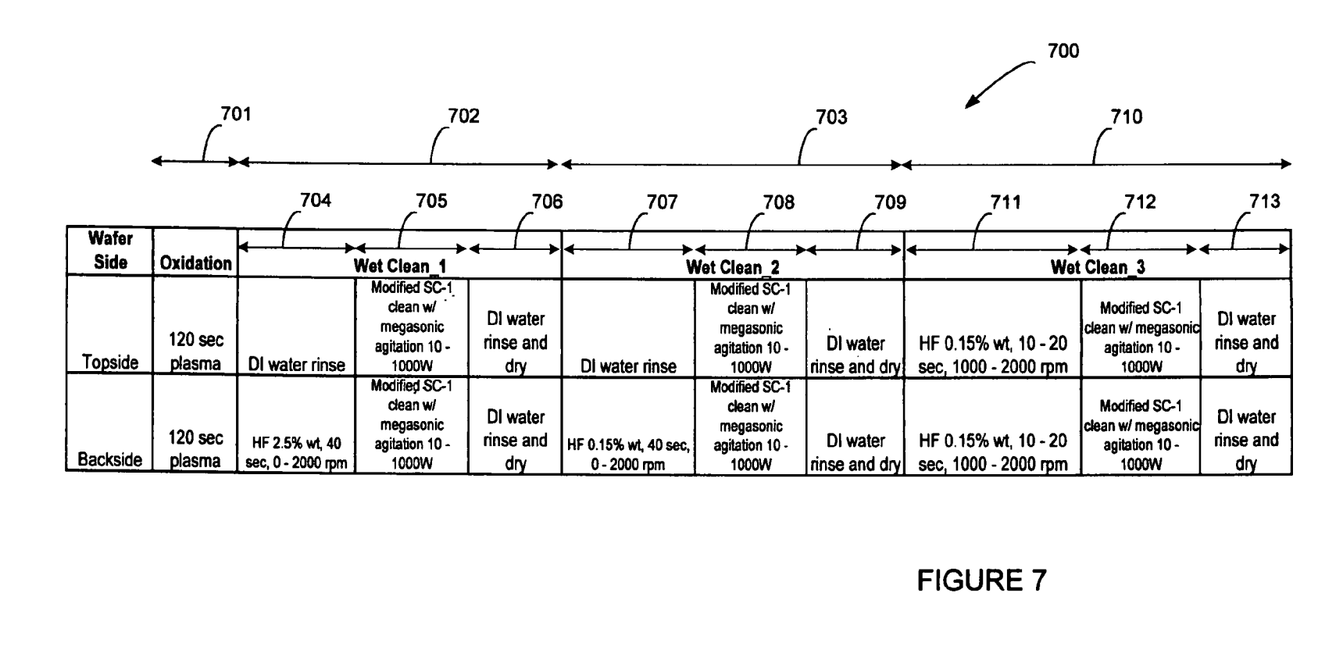
FIG. 7 shows a chart that summarizes an embodiment of the different wafer processes that can be used to clean a wafer after ion implantation during a wafer bonding process for SOI fabrication.

FIG. 7 shows a chart 700 that summarizes an embodiment of the different wafer processes that can be used to clean a wafer after ion implantation during a wafer bonding process for SOI fabrication. The different cleaning processes are performed in a multi-chamber processing system (e.g., 300) that integrates dry strip chambers and wet clean chambers. The cleaning process includes at least three main parts, a dry oxidizing process 701, a first wet clean process 702, and a second wet clean process 703. Performed in a dry strip chamber (e.g., 303), the oxidizing process 701 removes the particle defects through an oxidation reaction. Reactive neutral species from an energized gas (e.g., oxygen) reacts with polymeric or organic materials that make up the particle defects for removal from the topside and backside. The topside and backside are each exposed to the energized gas for about 120 seconds.

After the dry stripping process, the wafer undergoes a first wet cleaning operation 702 in a first wet clean chamber (e.g., 301), in which the topside and backside are simultaneously treated differently. The topside is rinsed with DI water and the backside is exposed to an etchant solution of about 2.5% weight HF for about 40 seconds at a rotational speed of about 0-50 revolutions per minute (rpm), process 704. The topside and backside are then exposed to a cleaning solution containing a modified SC-1 solution that includes ammonium hydroxide, hydrogen peroxide, water, a chelating agent, and a surfactant, process 705. The wafer is then rinsed with DI water and dried, process 706. The three processes of the first wet cleaning operation 702 are performed in the same wet clean chamber.

The wafer then undergoes a second wet cleaning operation 703 in the same wet clean chamber, in which a similar processing profile is applied to the topside and backside as in the first wet cleaning operation 702. The topside is again rinsed with DI water and the backside is treated with an etchant solution of about 0.15% weight HF for about 40 seconds at a rotational speed of about 0-50 rpm, process 707. The topside and backside are then exposed to the cleaning solution, process 708. The wafer is then rinsed with DI water and dried, process 709.

Optionally, the wafer can be treated with a third wet cleaning operation 710. In this process, both the topside and the backside are exposed to an etchant solution of about 0.15% weight HF for about 10-20 seconds at a rotational speed of about 1000-2000 revolutions per minute (rpm), process 711. The combination of a low concentration etchant for a relatively short exposure time enhances the removal of particles and contaminants during the SOI cleaning process. The topside and backside are then exposed to the cleaning solution, process 712. The wafer is then rinsed with DI water and dried, process 713.

In the foregoing specification, the invention has been described with reference to specific exemplary embodiments thereof. It will, however, be evident that various modifications and changes may be made thereto without departing from the broader spirit and scope of embodiments of the invention as set forth in the appended claims. The specification and figures are, accordingly, to be regarded in an illustrative rather than a restrictive sense.

What is claimed is:

1. A method to process a wafer after ion implantation, the method comprising:
   oxidizing, in a dry strip chamber, elastomeric particle defects on a topside and a backside of the wafer with an energized gas;
   rinsing, in a wet clean chamber integrated with the dry strip chamber and contained in a single wafer processing system, the topside with DI water;
   etching, in the wet clean chamber, the backside with a first etchant solution to remove a silicon oxide layer;
   exposing, in the wet clean chamber, the topside and the backside with a cleaning solution comprising ammonium hydroxide, hydrogen peroxide, and DI water;
   rinsing the wafer with DI water; and
   drying the wafer.

2. The method of claim 1, wherein oxidizing further comprises flowing an energized, oxygen-based reactive species to the topside and backside from about 10 seconds to about 500 seconds.

3. The method of claim 1, wherein etching further comprises dispensing the etchant solution simultaneously with the DI water to the topside.

4. The method of claim 3, wherein exposing further comprises dispensing the cleaning solution after rinsing the topside with DI water and etching the backside with the etchant solution.

5. The method of claim 4, wherein the etchant solution comprises between about 0.1% to about 40% hydrofluoric acid by weight.

6. The method of claim 5, wherein the exposing the backside with the etchant solution further comprises dispensing the hydrofluoric acid between about 10 seconds to about 60 seconds.

7. The method of claim 1, further comprising repeating an etchant operation to the backside of the wafer.

8. The method of claim 7, wherein repeating further comprises dispensing an etchant solution having a lower concentration relative to the etchant solution in a first operation.

9. The method of claim 1, further comprising transferring the wafer from the dry strip chamber to the wet clean chamber with a wafer handling device disposed within the single wafer processing system.

10. The method of claim 1, wherein exposing further comprises agitating the topside and backside with megasonic energy between about 10 W to about 1000 W.

11. The method of claim 1, further comprising, etching, in the wet clean chamber, the topside and the backside with a second etchant solution, the second etchant solution having a lower concentration relative to the first etchant solution.

12. The method of claim 1, wherein the cleaning solution further comprises a chelating agent and a surfactant.

13. A method to clean a wafer after ion implantation, the method comprising:
    inserting the wafer within a dry strip chamber to oxidize particle defects on a topside and a backside of the wafer;
    transferring the wafer from the dry strip chamber to a wet clean chamber integrated in a wafer processing system, the wet clean chamber to rinse the topside with DI water and to expose the backside with a first etchant solution;
    maintaining the wafer in the wet clean chamber to expose the topside and backside with a cleaning solution; and
    repeating a rinse to the topside with DI water and an exposure to the backside with a second etchant solution.

14. The method of claim 13, wherein transferring the wafer from the dry strip chamber to the first wet clean chamber further comprises transporting the wafer with a wafer handling device disposed within the single wafer processing system.

15. The method of claim 13, wherein inserting further comprises oxidizing the topside and the backside simultaneously with an oxygen-containing energized gas that reacts with elastomeric particle defects.

16. The method of claim 15, wherein oxidizing further comprises extending a plurality of lift pins from a wafer support pedestal to form reaction volumes near the backside and the topside for simultaneous processing in the dry strip chamber.

17. The method of claim 13, wherein transferring the wafer to the first wet clean chamber further comprises applying a megasonic energy between about 10 W to about 1000 W to agitate the topside and the backside of the wafer.

18. The method of claim 13, wherein the cleaning solution comprises ammonium hydroxide, hydrogen peroxide, DI water, a chelating agent, and a surfactant.

19. The method of claim 15, wherein oxidizing further comprises flowing the energized gas to the topside and the backside between about 10 seconds to about 500 seconds.

20. The method of claim 13, wherein the first etchant solution comprises a solution of about 2.5% weight hydrofluoric acid.

21. The method of claim 13, wherein the second etchant solution comprises a solution of about 0.15% weight hydrofluoric acid.

* * * * *